United States Patent
McLaughlin et al.

(10) Patent No.: US 9,069,139 B2
(45) Date of Patent: Jun. 30, 2015

(54) MULTICAST OPTICAL SWITCH

(75) Inventors: Sheldon McLaughlin, Ottawa (CA); Peter David Roorda, Ottawa (CA); Paul Colbourne, Ottawa (CA); Barrie Keyworth, Stittsville (CA)

(73) Assignee: JDS Uniphase Corporation, Milpitas, CA (US)

( * ) Notice: Subject to any disclaimer, the term of this patent is extended or adjusted under 35 U.S.C. 154(b) by 78 days.

(21) Appl. No.: 13/558,802

(22) Filed: Jul. 26, 2012

(65) Prior Publication Data

US 2013/0209031 A1 Aug. 15, 2013

Related U.S. Application Data

(60) Provisional application No. 61/512,459, filed on Jul. 28, 2011.

(51) Int. Cl.
*G02B 6/35* (2006.01)
*B81B 7/04* (2006.01)
*G02B 27/42* (2006.01)
*G02B 27/10* (2006.01)

(52) U.S. Cl.
CPC ............... *G02B 6/3546* (2013.01); *B81B 7/04* (2013.01); *G02B 6/3518* (2013.01); *G02B 27/42* (2013.01); *G02B 27/106* (2013.01); *G02B 27/1093* (2013.01); *G02B 6/3512* (2013.01); *G02B 6/3556* (2013.01)

(58) Field of Classification Search
CPC .. G02B 6/3546; G02B 6/3518; G02B 6/3512; G02B 6/3556; G02B 27/106; G02B 27/1093; G02B 27/42
See application file for complete search history.

(56) References Cited

U.S. PATENT DOCUMENTS

| | | | |
|---|---|---|---|
| 5,301,055 A * | 4/1994 | Bagchi et al. | 398/54 |
| 6,487,334 B2 | 11/2002 | Ducellier et al. | 385/22 |
| 6,650,802 B1 | 11/2003 | Morse et al. | 385/17 |
| 6,711,316 B2 | 3/2004 | Ducellier | 385/17 |
| 6,757,458 B2 | 6/2004 | Neilson et al. | 385/18 |
| 6,870,985 B2 | 3/2005 | Noonan | 385/17 |
| 7,039,267 B2 | 5/2006 | Ducellier et al. | 385/17 |
| 2003/0002781 A1 | 1/2003 | Ford et al. | 385/18 |
| 2005/0063643 A1 | 3/2005 | Watanabe et al. | 385/33 |
| 2007/0160321 A1 | 7/2007 | Wu et al. | 385/24 |
| 2009/0067845 A1 | 3/2009 | Zhong et al. | 398/83 |
| 2013/0202297 A1 * | 8/2013 | Martinelli et al. | 398/49 |
| 2014/0254982 A1 * | 9/2014 | Frisken et al. | 385/17 |

OTHER PUBLICATIONS

Alam, M.S.; Baker, A.M.A.; "Photonic MEMS based reconfigurable switch for multicast communication systems," 4th National Conference on Telecommunication Technology Proceedings, p. 171-175, Jan. 14-15, 2003.

* cited by examiner

*Primary Examiner* — Akm Enayet Ullah
(74) *Attorney, Agent, or Firm* — JDS Uniphase Corporation

(57) ABSTRACT

A multicast optical switch uses a diffractive bulk optical element, which splits at least one input optical beam into sub-beams, which freely propagate in a medium towards an array of directors, such as MEMS switches, for directing the sub-beams to output ports. Freely propagating optical beams can cross each other without introducing mutual optical loss. The amount of crosstalk is limited by scattering in the optical medium, which can be made virtually non-existent. Therefore, the number of the crossover connections, and consequently the number of inputs and outputs of a multicast optical switch, can be increased substantially without a loss or a crosstalk penalty.

18 Claims, 8 Drawing Sheets

MULTICAST OPTICAL SWITCH

CROSS-REFERENCE TO RELATED APPLICATIONS

The present invention claims priority from U.S. Provisional Patent Application No. 61/512,459 filed Jul. 28, 2011 which is incorporated herein by reference for all purposes.

TECHNICAL FIELD

The present invention relates to optical switching, and in particular to multicast optical switching in fiberoptic networks.

BACKGROUND OF THE INVENTION

In an optical communications network, an optical signal is modulated with digital information and transmitted over a length of optical fiber from a source location to a destination location. An optical cross-connect module allows switching of optical signals from one optical fiber to another. A multicasting optical switch allows one to switch optical signals from one optical fiber to not one but, simultaneously, to a plurality of optical fibers, or to switch optical signals from a plurality of input optical fibers to a plurality of output optical fibers, such that optical signals in any of the input optical fibers can be multicast into non-overlapping subsets of the plurality of the output optical fibers.

By way of example, referring to FIG. 1A, a 8×8 multicast optical switch 100 of the prior art includes eight input fibers 102, eight optical amplifiers 104, eight 1:8 optical splitters 106, eight 8×1 optical switches 108, and eight channel filters 110 coupled to output fibers 112. Each 1:8 splitter 106 connects an output of each amplifier 104 to an input of each 8×1 switch 108. A crossover region 107 includes a plurality of optical fibers connecting each of the eight outputs of each 1:8 splitter 106 to an input of each 8×1 switch 108. In operation, the amplifiers 104 boost multi-wavelength optical signals in the input fibers 102 to compensate for subsequent optical power splitting by the 1:8 splitters 106. Multi-wavelength signals from each of the eight input fibers 102 are present at the eight inputs of each 8×1 switch 108, which function to select multi-wavelength signals from only one of the input fibers 102. Since the 8×1 switches 108 operate independently on each other, the optical signals from any of the input fibers 102 can be multicast into any subset of the channel filters 110. The channel filters 110 select a channel of interest, that is, an optical signal at a particular center wavelength, to be outputted at the output fibers 112. The amplifiers 104 and the channel filters 110 are optional, and are included in FIG. 1A by way of an example. If the channel filters 110 are not included, the entire multi-wavelength signals will be present in the output fibers 112. Without the amplifiers 104, the signal will appear attenuated at the output fibers 112.

One drawback of the multicast optical switch 100 is complexity. The 1:8 splitters 106 and the 8×1 switches 108 are separate devices connected with a multitude of optical fibers in the crossover region 107, which complicates assembly, increases outer dimensions, and heightens optical losses. Since the 1:8 splitters 106 and the 8×1 switches 108 can both be fabricated using planar lightwave circuit (PLC) technology, one can integrate these components together onto a single substrate to obtain a relatively compact and inexpensive device, as compared with separate splitter and switch components of the multicast optical switch 100. At least two vendors—Enablence of Toronto, Canada; and Neophotonics of San Jose, USA—are offering such products. However, one challenge with the PLC implementation is the large number of waveguide crossovers involved. Referring now to FIG. 1B, a waveguide crossover region 117 of a 8×16 PLC multicast optical switch is shown. The example waveguide layout in FIG. 1B illustrates the large number of the waveguide crossovers. Even in a simpler case of an 8×12 multicast switch, a single waveguide has to cross up to 83 other waveguides before exiting the PLC. Each waveguide crossing adds loss and creates a possibility for unwanted crosstalk.

Accordingly, it is an object of the invention to provide a less complex multicast optical switch, which would not require waveguide or fiber crossovers.

SUMMARY OF THE INVENTION

The present invention uses optical beams freely propagating in a bulk optical medium, such as vacuum, air, glass, etc., to make optical crossovers required in a multicast optical switch. Freely propagating optical beams can cross each other without introducing mutual optical loss. The amount of crosstalk is limited by scattering in the optical medium, which can be made very low. Therefore, the number of the crossover connections, and consequently the number of inputs and outputs of a multicast optical switch, can be greatly increased. A diffractive bulk optical element can be used to provide optical beam splitting. Diffractive bulk optic beam splitters for splitting a multi-wavelength optical beam into two, four, eight, and sixteen beams of similar optical power are presently commercially available. Another important advantage of a bulk optic diffractive beamsplitter is that a single bulk beamsplitter can be used to split multiple input optical beams.

In accordance with the invention, there is provided a multicast optical switch comprising:

a first input port for receiving a first optical beam;

a diffractive bulk optical element coupled to the first input port, for splitting the first optical beam impinging on the diffractive bulk optical element into first and second beam portions propagating in a bulk optical medium;

first and second directors for receiving the first and second portions, respectively, of the first optical beam; and first and second output ports coupled to the first and the second directors, respectively, for outputting the first and the second portions of the first optical beam;

wherein the first and the second directors are configured for independently coupling the first and the second portions of the first optical beam, respectively, into the first and the second output ports, respectively.

The number of input and output optical ports can be easily scaled. According to the invention, there is provided a multicast optical switch further comprising M input ports for receiving M optical beams, N directors, and N output ports, wherein the first input port belongs to the M input ports, the first optical beam belongs to the M optical beams, the first and second directors belong to the N directors, and the first and second output ports belong to the N output ports, wherein M and N are integer numbers greater than 1;

wherein the diffractive bulk optical element is coupled to each of the M input ports, for splitting each of the M optical beams impinging on the diffractive bulk optical element into N beam portions propagating in the bulk optical medium, wherein the first and second portions of the first optical beam belong to the N beam portions;

wherein each of the N directors is configured for receiving a corresponding one of the N portions of each of the M optical beams;

wherein each of the N output ports is coupled to a corresponding one of the N directors and is configured for outputting a corresponding one of the N portions, respectively, of a selected one of the M optical beams; and wherein each of the N directors is configured for switching the corresponding portion of the selected one of the M optical beams into the corresponding one of the N output ports.

In a preferred embodiment, the diffractive bulk optical element is configured to angularly disperse each of the M optical beams into the N beam portions. The N directors are laterally offset from each other. The multicast optical switch of this embodiment further includes an angle-to-offset optical element having a focal length, for coupling each of the angularly dispersed N beam portions to one of the laterally offset N directors. The angle-to-offset optical element, preferably a concave mirror, is disposed one focal length away from the diffractive bulk optical element, and one focal length away from the N directors. The directors can include micro-electro-mechanical system (MEMS) tiltable mirrors.

In accordance with another aspect of the invention, there is further provided a dual multicast optical switch comprising first and second optical switches described above, wherein the concave mirrors of the angle-to-offset optical elements of the first and second optical switches comprise a same first concave mirror;

wherein the diffractive bulk optical elements of the first and second optical switches comprise a same first diffractive bulk optical element; and wherein the MEMS mirror arrays of the first and second switches optical comprise a same first MEMS mirror array.

In accordance with yet another aspect of the invention, there is further provided a method for multi-casting an optical signal, comprising:

(a) splitting a first optical signal into first and second signal portions using a diffractive bulk optical element;

(b) causing the first and second signal portions to propagate in a bulk optical medium; and (c) directing the first and second signal portions, respectively, propagated in step (b), to first and second output ports, respectively, using first and second directors.

BRIEF DESCRIPTION OF THE DRAWINGS

Exemplary embodiments will now be described in conjunction with the drawings, in which.

DETAILED DESCRIPTION OF THE INVENTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art.

Figure 1A:
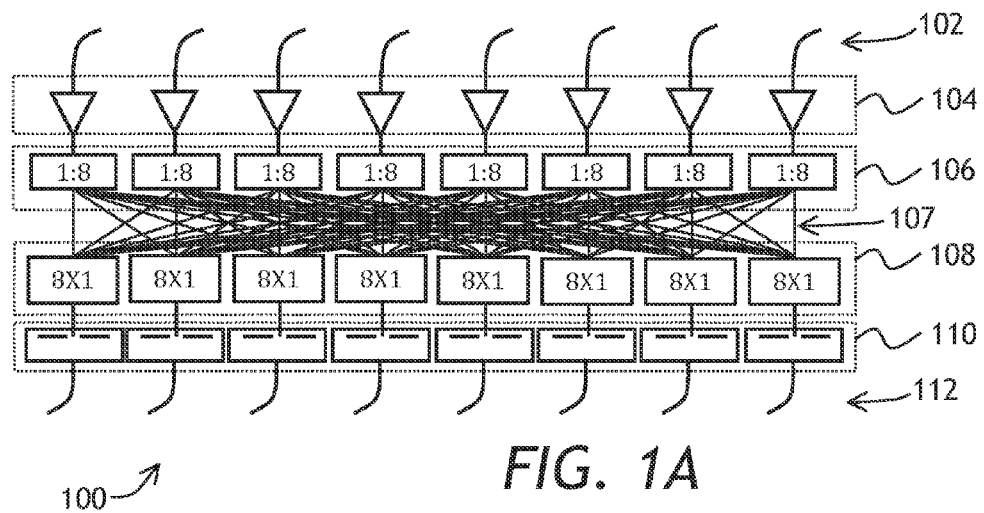
FIG. 1A is a block diagram of an 8×8 multicast optical switch of the prior art.
Figure 1B:
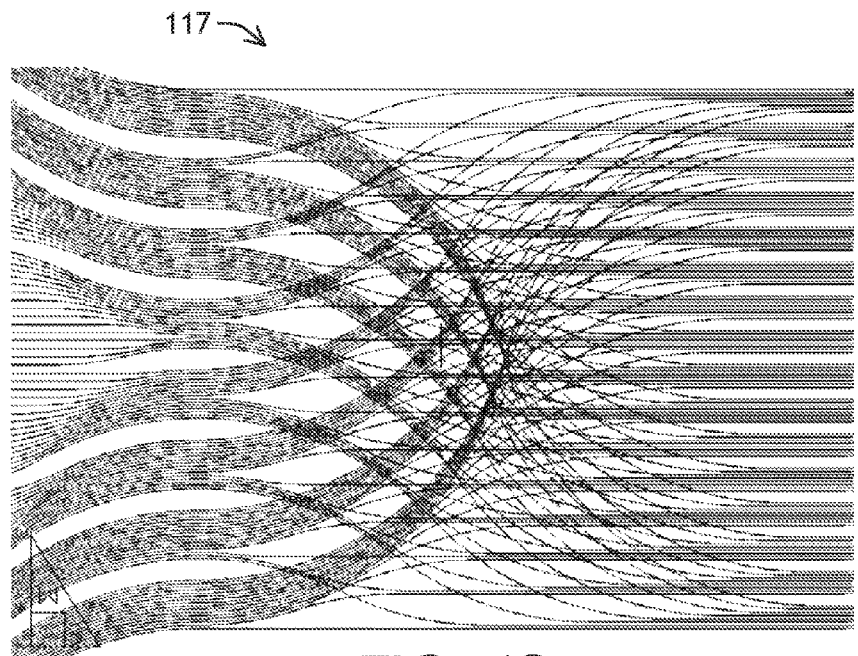
FIG. 1B is a plan view of a crossover region of a PLC 8×16 multicast optical switch of the prior art.
Figure 2A:
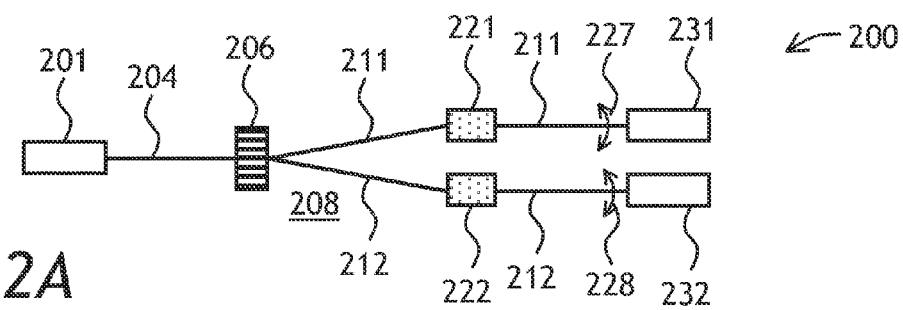
FIGS. 2A and 2B are block diagrams of embodiments of 1×2 and M×N multicast optical switches, respectively, according to the invention.

Referring to FIG. 2A, a multicast optical switch 200 of the invention includes a first input port 201 for receiving a first optical beam 204, which includes a plurality of wavelength channels, a diffractive bulk optical element 206 coupled to the first input port 201, for splitting the first optical beam 204 impinging on the diffractive bulk optical element 206 into first and second portions 211 and 212, respectively, which propagate in a bulk optical medium 208. Each of the first and second portions 211 and 212 includes a portion of each of the plurality of wavelength channels. First and second directors 221 and 222, respectively, receive the first and second portions 211 and 212 of the first optical beam 204. First and second output ports 231 and 232, respectively, are coupled to the first and the second directors 221 and 222, for outputting the first and second portions 211 and 212 of the first optical beam 204. In operation, the first and the second directors independently couple the first and the second beam portions 211 and 212 into the first and the second output ports 231 and 232. Arrows 227 and 228 indicate that the directors 221 and 222 couple the first and second portions 211 and 212 by angle tuning the portions 211 and 212, so as to introduce adjustable attenuation into the output ports 231 and 232, respectively.

By way of example, the "bulk optical medium" 208 can include vacuum, air or another gas, or glass or another dense but transparent material. The diffractive bulk optical element 206 divides the first optical beam 204 into the first and second beam portions 211 and 212, sending a portion of the first optical beam 204 to each output ports 231 and 232, substantially independently of wavelength(s) of the first optical beam 204, which can include a multi-wavelength optical beam of a wavelength-division-multiplexed (WDM) signal. Such beam splitting diffractive optical elements are available in standard or custom designs from multiple suppliers including MEMS Optical, Inc. of Huntsville, Ala., USA, and Leister Process Technologies, Axetris Division, Kaegiswil, Switzerland.

Figure 2B:
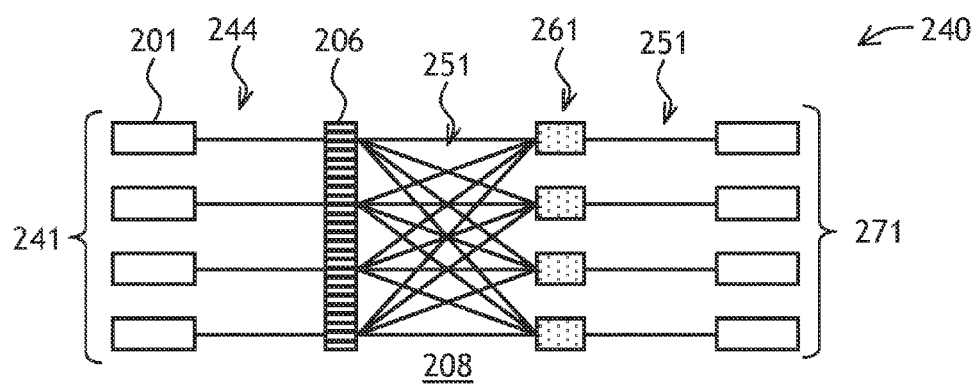

Turning to FIG. 2B with further reference to FIG. 2A, a multicast optical switch 240 is an M×N multiport version of the multicast optical switch 200 of FIG. 2A. The multicast optical switch 240 of FIG. 2B further includes M input ports 241 for receiving M optical beams 244, N directors 261, and N output ports 271. By comparing FIGS. 2A and 2B, one can see that the first input port 201 is one of the M input ports 241, the first optical beam 204 is one of the M optical beams 244, the first and second directors 221 and 222 are two of the N directors 261, and the first and second output ports 231 and 232 are two of the N output ports 271. In the embodiment shown, the multicast optical switch 240 has four input ports 241 and four output ports 271. Four ports were selected for ease of illustration. Generally, M and N can be integer numbers equal to or greater than two, of course within practical limits known to one of skill in the art.

The diffractive bulk optical element 206 is coupled to each of the M input ports 241, for splitting each of the M optical beams 244, impinging on the diffractive bulk optical element 206, into N beam portions 251 propagating in the bulk optical medium 208. The first and second portions 211 and 212 of the first optical beam of FIG. 2A are two of the N beam portions 251 of FIG. 2B. Each of the N directors 261 is configured for receiving a corresponding one of the N portions 251 of each of the M optical beams 244. Each of the N output ports 271 is coupled to a corresponding one of the N directors 261 and is configured for outputting a corresponding one of the N portions 251 of a selected one of the M optical beams 244. Each of the N directors 261 is configured for switching the corresponding portion of the selected one of the M optical beams 244 into the corresponding one of the N output ports 271. The directors 261 can include tiltable mirrors, for example MEMS mirrors, phased liquid crystal arrays, or any other suitable devices for controllably steering and/or displacing optical beams.

Figure 2C:
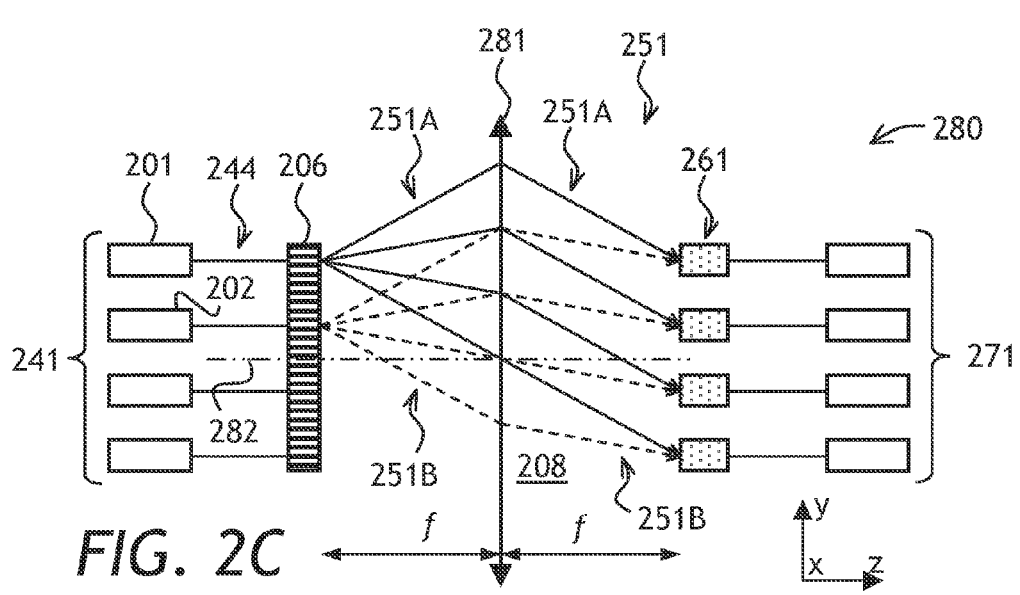
FIG. 2C is a block diagram of an embodiment of the M×N multicast optical switch of FIG. 2B, including an angle-to-offset (ATO) optical element.

The N portions 251 of the M optical beams 244 freely propagate in the bulk optical medium 208, to make the optical crossovers required in the multicast optical switch 240. Any suitable optics can be used to direct the N portions 251 of the M optical beams 244. Referring now to FIG. 2C, a preferable optical configuration for the optical crossovers is shown. In a multicast optical switch 280 of FIG. 2C, the diffractive bulk optical element 206 is configured to angularly disperse each of the M optical beams 244 into the N portions 251. The N portions of only two of the M optical beams 244, denoted at 251A with solid lines, and at 251B with dashed lines, are shown for clarity. Thus, the beam portions 251A and 251B are portions of two respective beams: one emitted from the first input port 201; and one emitted from a second input port 202, respectively, of the plurality of input ports 241. An angle-to-offset (ATO) optical element 281 couples each of the angularly dispersed N portions 251 to one of the N directors 261, which are offset from each other in a vertical direction in FIG. 2C. The ATO optical element 281 is disposed one focal length f away from the diffractive bulk optical element 206, and one focal length f away from the N directors 261. Although in FIG. 2C the ATO optical element 281 is shown as a lens having an optical axis 282, other elements having magnifying power, such as concave mirrors, can be used as well.

As evidenced by its name, the function of the ATO optical element (lens) 281 is to laterally offset the angularly dispersed N portions 251, so as to couple the N portions 251 to the corresponding N directors 261. Still referring to FIG. 2C, the angularly dispersed N portions 251A of the beam emitted by the first input port 201, shown with solid lines, are coupled to the N directors 261. The angularly dispersed N portions 251B of the beam emitted by the second input port 202, shown with dashed lines, are coupled to the same N directors 261, albeit at different angles of incidence. This occurs due to the ATO optical element 281 being disposed one focal length f away from the diffractive bulk optical element 206, and one focal length f away from the N directors 261. The function of the N directors 261 is to select the corresponding angularly dispersed portion 251 of one of the input optical beams 244 for coupling into a corresponding output port of the plurality of output ports 271. An angularly tunable element, such as a MEMS mirror, can be used for this purpose.

Figure 3A:
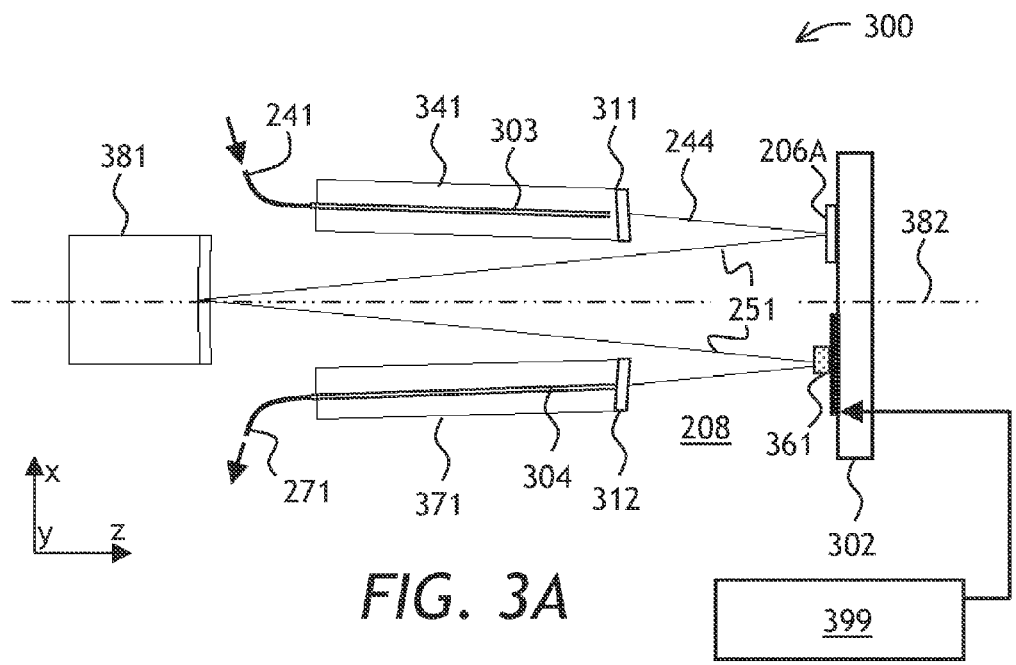
FIGS. 3A and 3B are side elevational and top views, respectively, of an embodiment of the M×N multicast optical switch of FIG. 2C, including a concave mirror as the ATO optical element, and a MEMS mirror array.
Figure 3B:
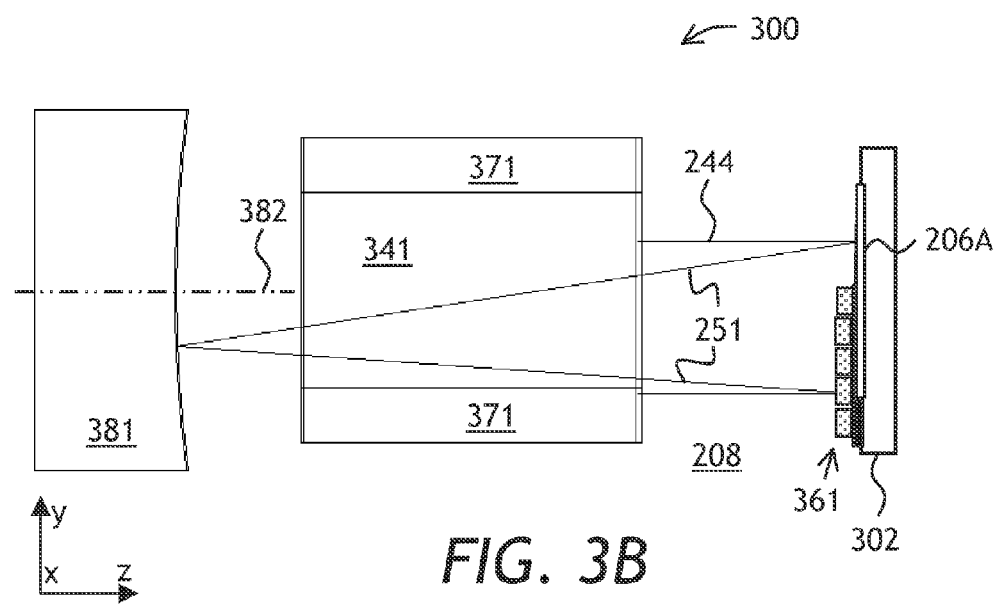

Referring to FIGS. 3A and 3B with further reference to FIG. 2C, a multicast optical switch 300 has a concave mirror 381 instead of the lens 281, a reflective bulk diffractive optical element 206A in place of the transmissive bulk diffractive optical element 206, and an array of MEMS mirrors 361 in place of the directors 261. Using the reflective elements 206A, 361, and 381 instead of the transmissive ones 206, 261, and 281 generally results in a more compact device, although in principle either transmissive or reflective elements, or both, could be used. Conveniently, in the reflective multicast optical switch 300, the bulk diffractive optical element 206A and the MEMS array 361 can be disposed on a common planar carrier 302. The concave mirror 381 has an optical axis 382.

An input waveguide array 341 is coupled to the plurality of input ports 241, and an output waveguide array 371 is coupled to the plurality of output ports 271. The input and output waveguide arrays 341 and 371 include M input and N output waveguides 303 and 304, respectively. Input and output microlens arrays 311 and 312, respectively, include M and N microlenses, respectively. Each of the M and N microlenses of the input and output microlens arrays 311 and 312 is optically coupled to one of the M and N optical waveguides of the input and output waveguide arrays 341 and 371, respectively. The function of the input and output microlens arrays 311 and 312 is to convert between spot sizes of the input and output waveguides 303 and 304, on one hand, and spot sizes on the bulk diffractive optical element 206A and the MEMS mirror array 361, on the other. This will be considered in more detail below.

In operation, the input waveguides 303 of the input waveguide array 341 guide the M input beams 244, which are collimated by the input microlens array 311, split into the N beam portions 251, get reflected by the concave mirror 381, and impinge onto the MEMS mirror array 361. The MEMS mirrors of the array 361 reflect the corresponding one of the N portions 251 of each of the M optical beams 244 at an adjustable angle, thereby causing the corresponding portion of each of the M optical beams 244 to bounce again off the concave mirror 381, get focused by a microlens of the output microlens array 312, and get coupled and into the corresponding one of the waveguides 304 of the output waveguide array 371, exiting from the corresponding one of the N output ports 271. In FIG. 3B, only one of the N portions 251 of only one of the M input beams 244 is shown for clarity. The remaining N portions 251 of the shown input beam are not shown. The remaining N portions are angularly dispersed by the bulk diffractive optical element 206A in a fan-like fashion, and are directed by the concave mirror 381 towards the other mirrors of the MEMS mirror array 361. This can be gleaned by comparing FIGS. 3B and 2C, which are drawn in the same plane of view (YZ plane). In FIG. 2C, all of the N portions of two of the M input beams 244, emanating from the to two input ports 201 and 202, are shown at 251A and 251B, respectively.

The angles of tilt of the MEMS mirrors of the array 361 are controlled by a controller 399. In one embodiment, the controller 399 is suitably configured for tilting at least one of the MEMS mirrors of the MEMS mirror array 361 at an adjustable angle to provide a controllable attenuation of the corresponding portion of the one of the M optical beams 244 coupled into the corresponding one of the N output ports 271. The hardware used to implement the controller 399 can be implemented with a general purpose processor, a digital signal processor (DSP), an application specific integrated circuit (ASIC), a field programmable gate array (FPGA) or other programmable logic device, discrete gate or transistor logic, discrete hardware components, or any combination thereof.

Figure 4:
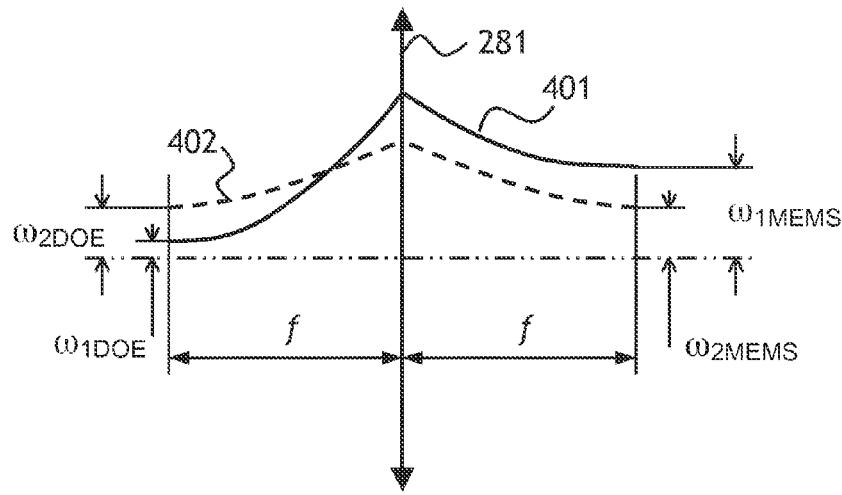
FIG. 4 is a beam profile diagram showing longitudinal beam profiles of Gaussian beams propagating through the ATO optical element of FIG. 2C.

Referring now to FIG. 4 with further reference to FIGS. 2C and 3A, a first longitudinal beam profile 401 of a beam portion of the N portions 251 is shown in a solid line. The input optical beams 244 are preferably Gaussian or near-Gaussian optical beams. The microlenses of the input microlens array 311 place the Gaussian beam waist on the bulk diffractive optical element 206A. The first longitudinal beam profile 401 corresponds to the Gaussian waist radius $\omega_{1DOE}$. Since the ATO element (lens) 281 in FIG. 2C, corresponding to the concave mirror 381 in FIGS. 3A and 3B, is disposed one focal length f away from the Gaussian waist, the N portions 251 will have Gaussian waist at the directors 261, corresponding to the MEMS mirrors 361, having a Gaussian waist radius $\omega_{1MEMS}$. Increasing the Gaussian beam waist size at the bulk diffractive optical element 206 or 206A from $\omega_{1DOE}$ to $\omega_{2DOE}$ will result in decreasing of the Gaussian beam waist at the directors 261 or the MEMS mirrors 361 from $\omega_{1MEMS}$ to $\omega_{2MEMS}$, as indicated by a second longitudinal beam profile 402 shown with dashed line. For zero-order Gaussian beams, the relationship between f, $\omega_{DOE}$, and $\omega_{MEMS}$ can be expressed as follows:

$$f = \frac{\pi \omega_{DOE} \omega_{MEMS}}{\lambda} \quad (1)$$

wherein $\lambda$ is a center wavelength of the M input optical beams 244.

Figure 5:
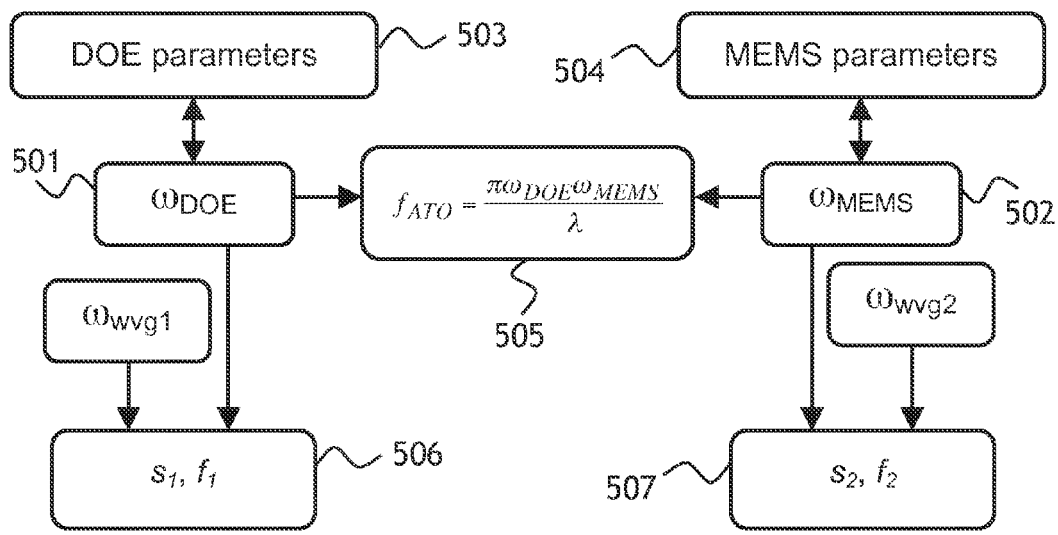
FIG. 5 is a flow chart of a method for calculating required focal lengths of the concave mirror and microlenses of the M×N multicast optical switch of FIGS. 3A and 3B.

Turning to FIG. 5 with further reference to FIGS. 2C, 3A, and 3B, the focal length f of the ATO element 281 and/or concave mirror 381, and the focal lengths $f_1$ and $f_2$ of the microlenses of the arrays 311 and 312, respectively, can be calculated as follows. In steps 501 and 502, spot radiae $\omega_{DOE}$ and $\omega_{MEMS}$ are determined by corresponding optical/geometrical parameters 503 and 504 of the bulk diffractive optical element 206A and the MEMS array 361, respectively. The spot radii $\omega_{DOE}$ and $\omega_{MEMS}$ do not have to be equal to each other; in fact, these are likely to be different from each other due to different optical/geometrical parameters 503 and 504 of the bulk diffractive optical element 206A and the MEMS array 361, respectively. From the spot radii $\omega_{DOE}$ and $\omega_{MEMS}$, the focal length of the ATO optical element can be computed in a step 505 using the Eq. (1) above. A distance $s_1$ from a proximal tip of the waveguides 303 of the input waveguide array 341 to the microlenses of the input microlens array 311 can be calculated in a step 506 from the equation $$s_1 = f_1 \left( 1 + \sqrt{\frac{\omega_{DOE}^2}{\omega_{wvg1}^2} - \frac{z_{RDOE}^2}{f_1^2}} \right) \quad (2)$$

wherein $z_{R\,DOE}$ is a Rayleigh length of the M optical beams 244 impinging on the diffractive bulk optical element 206A, and $\omega_{wvg1}$ is a mode radius of a light mode propagating in the waveguides 303 of the input waveguide array 341. Similarly, a distance $s_2$ from a proximal tip the waveguides 304 of the output waveguide array 371 to the microlenses of the output microlens array 312 can be calculated in a step 507 from the equation $$s_2 = f_2 \left( 1 + \sqrt{\frac{\omega_{MEMS}^2}{\omega_{wvg2}^2} - \frac{z_{RMEMS}^2}{f_2^2}} \right) \quad (3)$$

wherein $z_{R\,MEMS}$ is a Rayleigh length of the N portions 251 of each of the M optical beams 244, reflected from the MEMS mirror array 361, and $\omega_{wvg2}$ is a mode radius of a light mode propagating in the waveguides 304 of the output waveguide array 371. The Rayleigh length $z_R$ is defined as $$z_R = \frac{\pi \omega^2}{\lambda},$$

wherein $\lambda$ is a central wavelength.

Figure 6A:
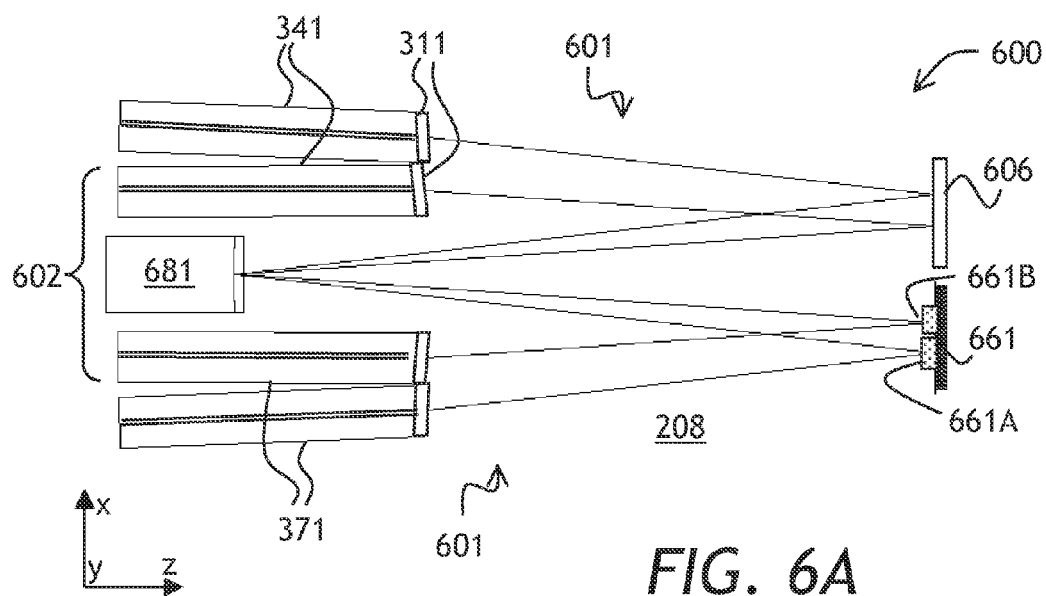
FIG. 6A is a side elevational view of a dual multicast optical switch with independent operation of the individual multicast optical switches.

Turning to FIG. 6A with further reference to FIGS. 3A and 3B, a dual multicast optical switch 600 includes first and second optical switches 601 and 602, respectively, each being equivalent to the multicast optical switch 300 of FIGS. 3A and 3B. The concave mirrors 381 of the first and second optical switches 601 and 602 are replaced with a same concave mirror 681. The diffractive bulk optical elements 206A of the first and second switches 601 and 602 are replaced with a same diffractive bulk optical element 606. The MEMS mirror arrays 361 of the first and second switches 601 and 602 are replaced with a same dual-row MEMS mirror array 661.

As the name suggests, the dual-row MEMS mirror array 661 includes first and second rows 661A and 661B, respectively, of MEMS mirrors. The MEMS mirrors of the first and second rows 661A and 661B are the MEMS mirrors of the first and second switches 601 and 602, respectively. The first and second switches 601 and 602 are operable independently of each other. Thus, two independent multicast optical switches 601 and 602 are provided with the common diffractive bulk optical element 606, the MEMS array 661, and the concave mirror 681, providing considerable savings of cost and size.

Figure 6B:
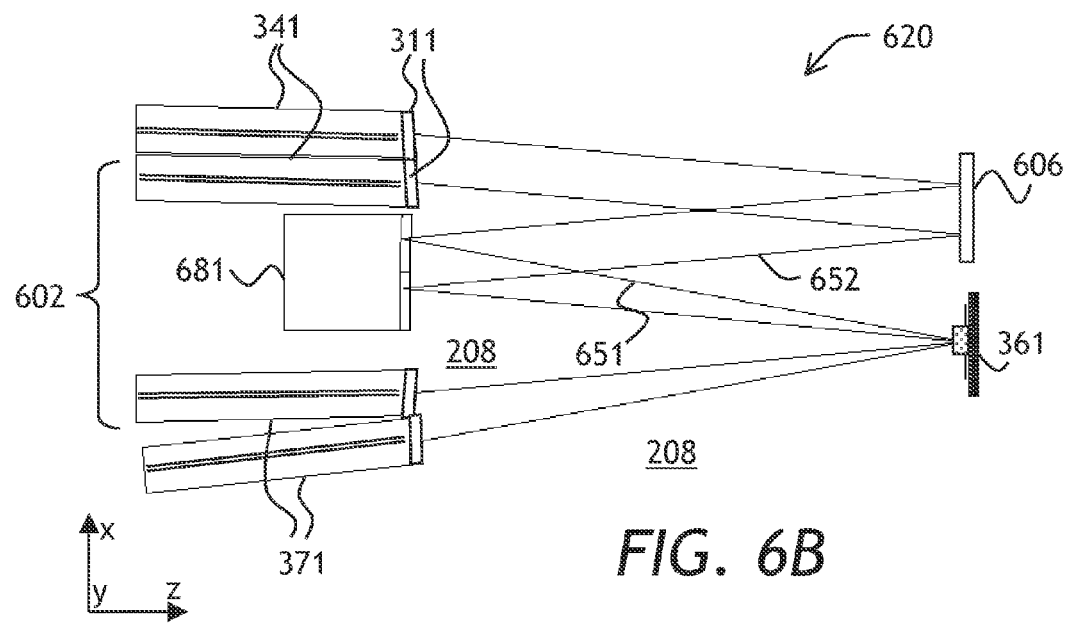
FIG. 6B is a side elevational view of a dual multicast optical switch with a ganged operation of the individual multicast optical switches.

Referring now to FIG. 6B with further reference to FIG. 6A, a ganged dual multicast optical switch 620 is similar to the dual multicast optical switch 600 of FIG. 6A, the difference being that the dual MEMS mirror array 661 is replaced with the single-row MEMS mirror array 361. The two input waveguide arrays 341 are placed parallel to each other in the ganged dual multicast optical switch 620 of FIG. 6B, ensuring that beam portions 651 and 652 diffracted by the diffractive bulk optical element 606 fall on same MEMS mirrors of the single-row MEMS mirror array 361. The two multicast optical switches 601 and 602 operate in a ganged fashion, that is, with the same switch states, since they use the same MEMS mirrors of the MEMS array 361. By way of example, if an $k^{th}$ input of the first optical switch 601 is routed to its $l^{th}$ output, an $k^{th}$ input of the second optical switch 602 will be routed to its corresponding $l^{th}$ output. By way of another example, if the $k^{th}$ input of the first optical switch 601 is multicast to $l^{th}$ to $m^{th}$ outputs thereof, the $k^{th}$ input of the second optical switch 602 will be simultaneously multicast to $l^{th}$ to $m^{th}$ outputs thereof. This function is useful in an Add/Drop configuration, where the first multicast optical switch 601 carries Add signals and the second multicast optical switch 602 carries Drop signals. It is common that Add and Drop signals will have the same configuration, since most communication links are bi-directional, sending and receiving information to and from the same direction, so the ganged operation is not a drawback in that application. The advantage is the savings in the MEMS chip 361, requiring only one MEMS mirror array instead of two. Savings in packaging are also significant.

An important advantage of the free-space architecture of the multicast optical switches 200, 240, 280, 300, 600, and 620 of FIGS. 2A, 2B, 2C, 3A-3B, 6A, and 6B, respectively, is their scalability to large port counts. For example, the optical switches 240, 280, and 300 of FIGS. 2B, 2C, and 3A-3B, respectively, can be easily scaled to the port counts with $M \geq 4$ and $N \geq 8$. In the dual switches 600 and 620 of FIGS. 6A and 6B, respectively, the port counts of the individual multicast optical switches 601 and 602 can also be increased to $M \geq 4$ and $N \geq 8$.

One drawback of the large port counts is that the angular spread of the diffractive bulk optical elements 206, 206A, and 606 can become too broad, so that optical aberrations and/or footprint of the outer diffracted beam portions become unacceptably large. The problem of aberrations and/or large footprint can be mitigated by constructing the diffractive bulk optical elements 206, 206A, and 606 in such a way as to provide angular spread of the diffracted beam portions 251 and 651 not in one but in two dimensions.

Figures 7A, 7B:
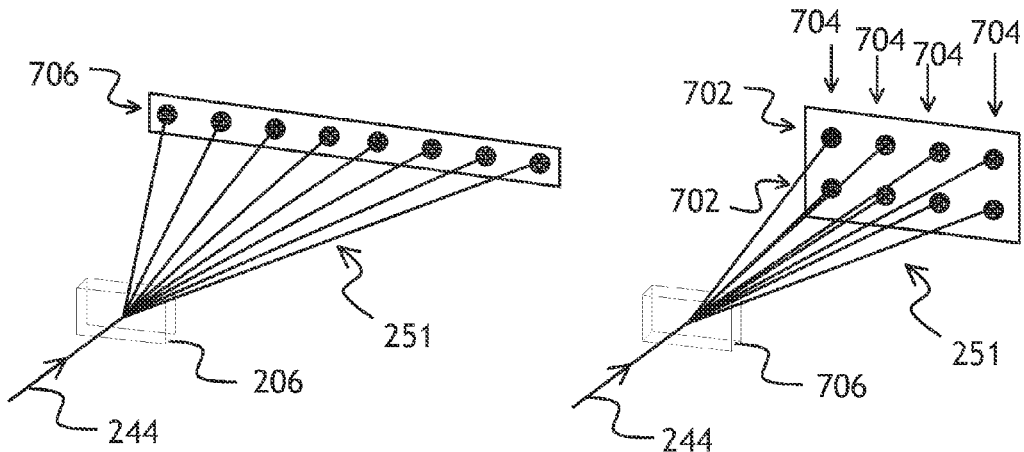
FIGS. 7A and 7B are three-dimensional views of diffractive bulk optical elements configured to angularly disperse an optical beam in a single and a double row, respectively, of the optical beam portions.

The latter point is illustrated in FIGS. 7A and 7B. A diffractive bulk optical element 706 of FIG. 7B is configured to angularly disperse each of the M optical beams 244 into two rows 702 and four columns 704 of eight portions 251 of each of the M optical beams 244, whereas the diffractive bulk optical element 206, shown in FIG. 7A for comparison, angularly disperses each of the M optical beams 244 into a single row 706 of eight portions 251 of the M optical beams 244. Of course the two rows 702 and the four columns 704 are only examples, and other numbers $N_1$ and $N_2$ of the rows 72 and columns 704 are possible, wherein $N=N_1 \cdot N_2$, for $N \geq 4$. The angular pattern of the spread portions 251 can be rectangular, hexagonal, etc, with the MEMS mirror arrays 361 or 661 matching that pattern. The diffractive bulk optical element 706 can also be made reflective, not transmissive as shown in FIG. 7B for illustration purposes.

Figure 8A:
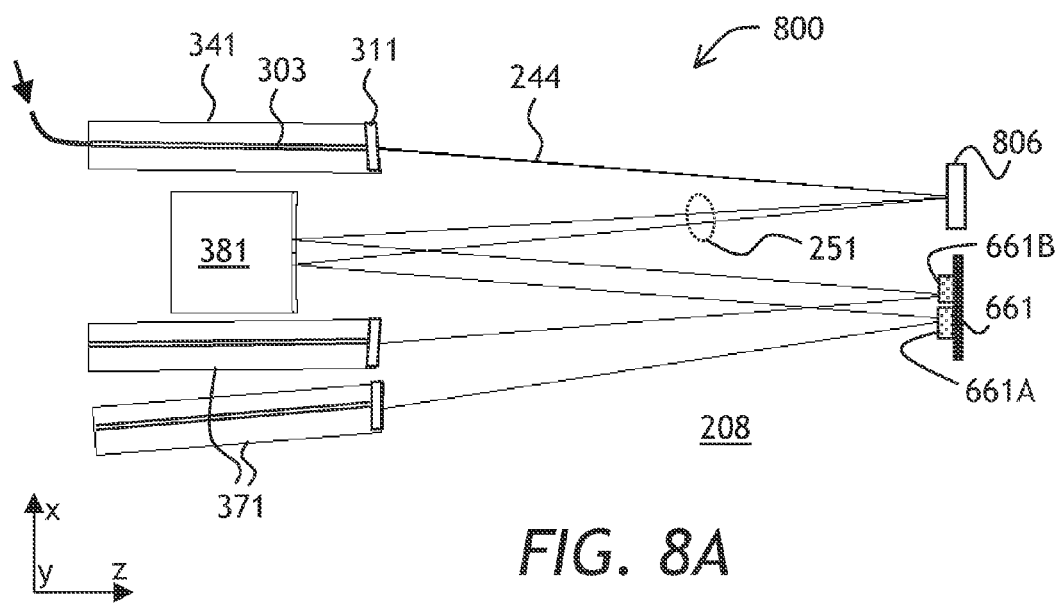
FIG. 8A is a side elevational view of a multicast optical switch using a double-row diffractive bulk optical element.

Turning to FIG. 8A with further reference to FIGS. 3A and 3B, a multicast optical switch 800 uses a reflective, two-dimensional, diffractive bulk optical element 806 similar to the diffractive bulk optical element 706 of FIG. 7B but working in reflection. Functionally, the multicast optical switch 800 is similar to the multicast optical switch 300 of FIGS. 3A and 3B, with the two-row MEMS array 661 replacing the single-row MEMS array 361. In operation, the N portions 251 of the M input optical beams 244 are spread by the diffractive bulk optical element 706 into two rows of N/2 portions 251 and are redirected by the concave mirror 381 to impinge on the first and second rows 661A and 661B of MEMS mirrors, respectively, which then select a portion of a particular input beam of the M input optical beams 244 for coupling into the corresponding output waveguide array(s) 371. Since each MEMS mirror of the two-row MEMS mirror array 661 is associated with only one particular waveguide of the output waveguide arrays 371, the functioning of the multicast optical switch 800 is substantially identical to the functioning of the multicast optical switch 300 of FIGS. 3A and 3B, requiring tilt of the MEMS mirrors only in the YZ plane; although two-plane tilting may be desirable to provide ""hitless" operation. As noted above, the configuration of the MEMS mirror array 661 must be coordinated with the configuration of the beam portions 251 diffracted by the diffractive bulk optical element 806. For example, if the diffractive bulk optical element 806 diffracts the M input optical beams 244 into $N_1$ rows and $N_2$ columns of the beam portions 251, the MEMS mirror array 661 must also have $N_1$ rows and $N_2$ columns of MEMS mirrors, wherein $N=N_1 \cdot N_2$.

Figure 8B:
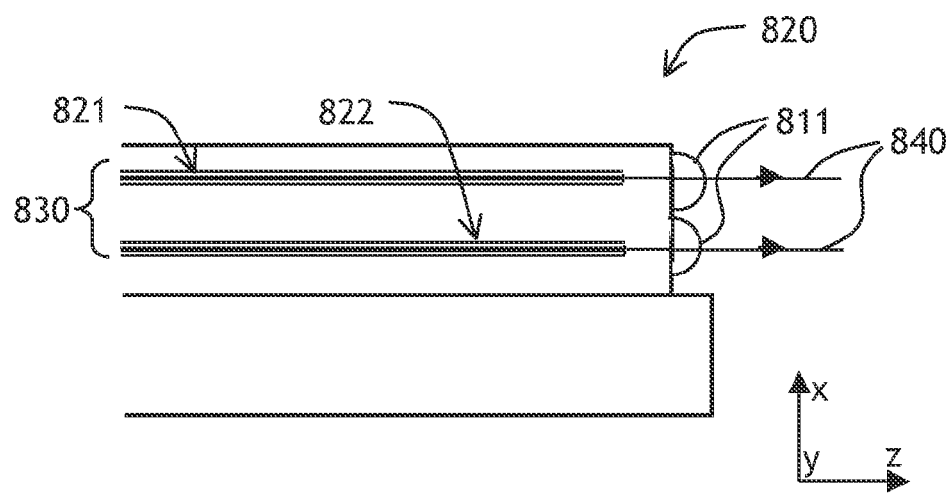
FIGS. 8B and 8C are side elevational views of a dual-row optical fiber array usable in the multicast optical switches of FIGS. 6A, 6B, and 8A.
Figure 8C:
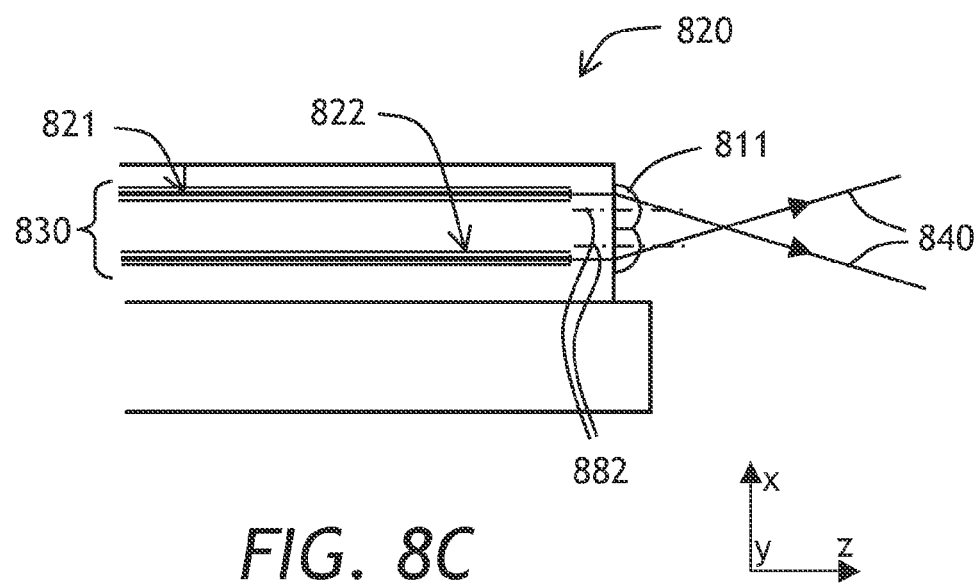

Turning to FIGS. 8B and 8C with further reference to FIGS. 6A, 6B, and 8A, a dual-row fiber array 820 includes parallel top and bottom rows 821 and 822, respectively, of optical fibers 830. Microlenses 811 are coupled to the respective optical fibers 830. The dual-row fiber array 820 can be used in the dual multicast optical switch 600 and/or 620 of FIGS. 6A and 6B in place of the two input 341 and/or the two output 371 single-row fiber arrays. In the multicast optical switch 800 of FIG. 8A, a multi-row optical fiber array including $N_1$ rows of $N_2$ optical fibers can be used in place of the two single-row output fiber arrays 371. To make input/output beams 840 emitted by the top and bottom rows 821 and 822 of the optical fibers 830 non-parallel to each other, the fibers 830 can be laterally displaced with respect to optical axes 882 of the microlenses 811, as shown in FIG. 8C. The lateral displacement along the X axis will ensure that the input/output beams 840 exit at an angle with respect to the optical axes 882 of the microlenses 811.

Figure 9:
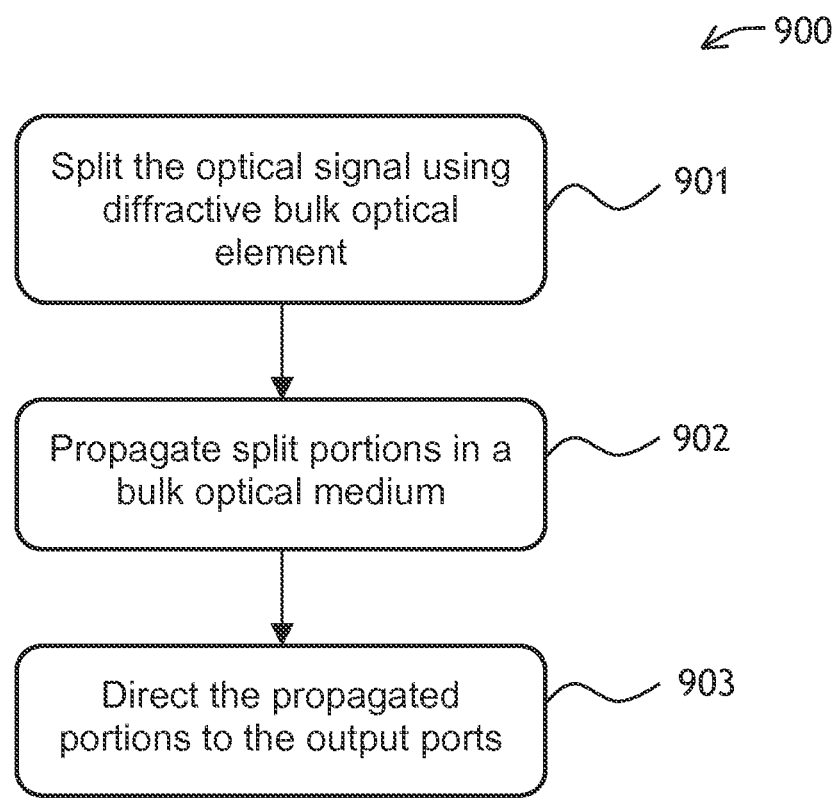
FIG. 9 is a flow chart of a method for multi-casting an optical signal according to the invention.

Turning now to FIG. 9 with further reference to FIG. 2A, a method 900 for multi-casting an optical signal includes a step 901 of using the diffractive bulk optical element 206 to split a first optical signal, i.e. the optical beam 204, into first and second signal portions, i.e. the beam portions 211 and 212. In a step 902, the first and second signal portions are propagated in the bulk optical medium 208. In a step 903, the first and second directors 221 and 222 are used to direct the first and second signal portions propagated in the step 902 to the first and second output ports 231 and 232, respectively. Also, in the step 903, the first and the second signal portions 211 and 212 are independently and controllably coupled into the first and the second output ports 231 and 232, respectively.

Still referring to FIG. 9 with further reference to FIG. 2B, the method 900 can be extended for multicast, multiport switching of M optical signals between N output ports. For multicast, multiport M×N optical switching, the step 901 includes using the diffractive bulk optical element 206 to split each of M optical signals including the first optical signal, i.e. the input optical beams 244 including the first input optical beam 204, into N signal portions including the first and second signal portions, i.e. the N optical beam portions 251 including the first and second beam portions 211 and 212. The step 902 includes propagating the N portions 251 of each of the M optical signals 244 in the bulk optical medium 208. The step 903 includes using the N directors 261 comprising the first and second directors 211 and 212 to direct the N signal portions 251, propagated in the step 902, to the N output ports 271 including the first and second output ports 231 and 232. Each of the N directors 261 is configured for receiving a corresponding one of the N portions 251 of each of the M optical signals 244. Each of the N output ports 271 is coupled to a corresponding one of the N directors 261 and is configured for outputting a corresponding one of the N portions 251 of a selected one of the M optical signals 244. The step 903 also includes using each of the N directors 261 to switch the corresponding portion of the selected one of the M optical signals 244 into the corresponding one of the N output ports 271.

Still referring to FIG. 9 with further reference to FIG. 2C, the ATO element 281 can be used in the step 902 of the method 900 when, in the step 901, each of the M optical signals 244 is angularly dispersed. In the step 902, the ATO element 281 is used to couple each of the angularly dispersed N signal portions 251 to one of the N directors 261 laterally offset from each other. The step 902 also includes disposing the ATO optical element 281 substantially one focal length f away from the diffractive bulk optical element 206, and substantially one focal length f away from the N directors 261. In one embodiment, the step 903 includes using at least one of the N directors 261 to provide a controllable attenuation of the corresponding portion of the one of the M optical signals 244 coupled into the corresponding one of the N output ports 271.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A multicast optical switch comprising:
a first input port for receiving a first optical beam;
a diffractive bulk optical element coupled to the first input port, for splitting the first optical beam impinging on the diffractive bulk optical element into first and second beam portions propagating in a bulk optical medium;
first and second directors for receiving the first and second portions, respectively, of the first optical beam; and
first and second output ports coupled to the first and the second directors, respectively, for outputting the first and the second portions of the first optical beam;
wherein the first and the second directors are configured for independently coupling the first and the second portions of the first optical beam, respectively, into the first and the second output ports, respectively.

2. The multicast optical switch of claim 1, comprising
M input ports for receiving M optical beams,
N directors, and
N output ports,
wherein the first input port belongs to the M input ports, the first optical beam belongs to the M optical beams, the first and second directors belong to the N directors, and the first and second output ports belong to the N output ports, wherein M and N are integer numbers greater than 1;
wherein the diffractive bulk optical element is coupled to each of the M input ports, for splitting each of the M optical beams impinging on the diffractive bulk optical element into N beam portions propagating in the bulk optical medium, wherein the first and second portions of the first optical beam belong to the N beam portions;
wherein each of the N directors is configured for receiving a corresponding one of the N portions of each of the M optical beams;
wherein each of the N output ports is coupled to a corresponding one of the N directors and is configured for outputting a corresponding one of the N portions of a selected one of the M optical beams; and
wherein each of the N directors is configured for switching the corresponding portion of the selected one of the M optical beams into the corresponding one of the N output ports.

3. The multicast optical switch of claim 2, wherein the diffractive bulk optical element is configured to angularly disperse each of the M optical beams into the N beam portions,
wherein the multicast optical switch further comprises an angle-to-offset optical element having a focal length, for coupling each of the angularly dispersed N beam portions to one of the N directors, wherein the N directors are laterally offset from each other, and
wherein the angle-to-offset optical element is disposed substantially one focal length away from the diffractive bulk optical element, and substantially one focal length away from the N directors.

4. The multicast optical switch of claim 3, wherein each of the N directors comprise a tiltable MEMS mirror of a MEMS mirror array, for reflecting the corresponding one of the N portions of each of the M optical beams at a controllable angle, thereby switching the corresponding portion of the one of the M optical beams into the corresponding one of the N output ports.

5. The multicast optical switch of claim 4, wherein the angle-to-offset optical element comprises a concave mirror.

6. The multicast optical switch of claim 5, further comprising a planar carrier,
wherein the diffractive bulk optical element is reflective; and
wherein the MEMS mirror array and the reflective diffractive bulk optical element are disposed on the planar carrier.

7. The multicast optical switch of claim 4, wherein the M optical beams have a center wavelength $\lambda$, wherein in operation, the M optical beams impinging on the diffractive bulk optical element have a beam waist radius $\omega_{DOE}$, and the N portions of each of the M optical beams impinging on the MEMS mirror array have a beam waist radius $\omega_{MEMS}$, wherein the focal length of the angle-to-offset optical element is substantially equal to $$f = \frac{\pi \omega_{DOE} \omega_{MEMS}}{\lambda}.$$

8. The multicast optical switch of claim 7, wherein $\omega_{DOE} \neq \omega_{MEMS}$.

9. The multicast optical switch of claim 7, further comprising first and second waveguide arrays comprising M and N optical waveguides, respectively, coupled to the M input ports and N output ports, respectively, and first and second microlens arrays comprising M and N microlenses, respectively, wherein each of the M and N microlenses of the first and second microlens arrays is optically coupled to one of the M and N optical waveguides of the first and second waveguide arrays, respectively.

10. The multicast optical switch of claim 9,
wherein each microlens of the first array has a focal length $f_1$ and is disposed at a distance $S_1$ from a proximal tip of a corresponding waveguide of the first waveguide array, $f_1$ and $S_1$ satisfying the formula $$s_1 = f_1 \left(1 + \sqrt{\frac{\omega_{DOE}^2}{\omega_{wvg1}^2} - \frac{z_{RDOE}^2}{f_1^2}}\right),$$

wherein $z_{R\,DOE}$ is a Rayleigh length of the M optical beams impinging on the diffractive bulk optical element, and $\omega_{wvg1}$ is a mode radius of a light mode propagating in the waveguides of the first array; and
wherein each microlens of the second array has a focal length $f_2$ and is disposed at a distance $s_2$ from a proximal tip of a corresponding waveguide of the second waveguide array, $f_2$ and $s_2$ satisfying the formula $$s_2 = f_2 \left( 1 + \sqrt{\frac{\omega_{MEMS}^2}{\omega_{wvg2}^2} - \frac{z_{RMEMS}^2}{f_2^2}} \right),$$

wherein $z_{R\,MEMS}$ is a Rayleigh length of the N portions of each of the M optical beams, reflected from the MEMS mirror array, and $\omega_{wvg2}$ is a mode radius of a light mode propagating in the waveguides of the second array.

11. The multicast optical switch of claim 2, wherein M≥4 and N≥8.

12. The multicast optical switch of claim 3, wherein N≥4, wherein the diffractive bulk optical element is configured to angularly disperse each of the M optical beams into $N_1$ rows and $N_2$ columns of the N portions of each of the M optical beams, wherein $N=N_1 \cdot N_2$.

13. The multicast optical switch of claim 9, wherein N≥4, wherein the diffractive bulk optical element is configured to angularly disperse each of the M optical beams into $N_1$ rows and $N_2$ columns of the N portions of each of the M optical beams, wherein $N=N_1 \cdot N_2$, and
wherein the second waveguide array comprises a multi-row optical fiber array including $N_1$ rows of $N_2$ optical fibers.

14. The multicast optical switch of claim 4, further comprising a controller for controlling the tiltable MEMS mirrors of the MEMS mirror array,
wherein the controller is suitably configured for tilting at least one of the MEMS mirrors of the MEMS mirror array to provide an adjustable attenuation of the corresponding portion of the one of the M optical beams coupled into the corresponding one of the N output ports.

15. A dual multicast optical switch comprising first and second optical switches,
wherein the first and second optical switches each comprise the multicast optical switch of claim 4;
wherein the angle-to-offset optical elements of the first and second optical switches comprise a same first angle-to-offset optical element;
wherein the diffractive bulk optical elements of the first and second optical switches comprise a same first diffractive bulk optical element; and
wherein the MEMS mirror arrays of the first and second switches optical comprise a same first MEMS mirror array.

16. A dual multicast optical switch comprising first and second optical switches,
wherein the first and second optical switches each comprise the multicast optical switch of claim 9;
wherein the angle-to-offset optical elements of the first and second optical switches comprise a same first angle-to-offset element;
wherein the diffractive bulk optical elements of the first and second optical switches comprise a same first diffractive bulk optical element;
wherein the MEMS mirror arrays of the first and second switches optical comprise a same first MEMS mirror array; and
wherein at least one of the first and second waveguide arrays comprises a dual-row optical fiber array including two rows of N optical fibers.

17. The dual multicast optical switch of claim 15, wherein the first MEMS mirror array comprises first and second rows of MEMS mirrors, wherein the MEMS mirrors of the first and second rows are the MEMS mirrors of the first and second optical switches, respectively, whereby the first and second optical switches are operable independently of each other.

18. The dual multicast optical switch of claim 15, wherein the first MEMS mirror array comprises a first row of MEMS mirrors, wherein each of the MEMS mirrors of the first and second optical switch comprises a same MEMS mirror of the first row, whereby the first and second switches are operable in a gang fashion.

* * * * *